(12) United States Patent
Kim

(10) Patent No.: US 11,264,994 B1
(45) Date of Patent: Mar. 1, 2022

(54) DELAY CIRCUIT AND A DELAY LOCKED LOOP CIRCUIT USING THE SAME

(71) Applicant: SK hynix Inc., Icheon-si (KR)

(72) Inventor: Young Ouk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/179,066

(22) Filed: Feb. 18, 2021

(30) Foreign Application Priority Data

Oct. 19, 2020 (KR) .................. 10-2020-0134983

(51) Int. Cl.
*H03L 7/081* (2006.01)
*H03L 7/07* (2006.01)
*H03K 5/133* (2014.01)

(52) U.S. Cl.
CPC .......... *H03L 7/0818* (2013.01); *H03K 5/133* (2013.01); *H03L 7/07* (2013.01); *H03L 7/0814* (2013.01); *H03L 7/0816* (2013.01)

(58) Field of Classification Search
CPC ....... H03L 7/0818; H03L 7/07; H03L 7/0814; H03L 7/0816; H03K 5/133
See application file for complete search history.

(56) References Cited

U.S. PATENT DOCUMENTS

| | | | | |
|---|---|---|---|---|
| 8,624,644 B2 * | 1/2014 | Gomm | ................. | H03L 7/0816 327/158 |
| 8,648,635 B2 * | 2/2014 | Willey | ..................... | H03L 7/08 327/158 |
| 9,197,202 B2 | 11/2015 | Jang et al. | | |
| 10,026,462 B1 * | 7/2018 | Ma | .......................... | G11C 7/222 |
| 10,056,909 B1 * | 8/2018 | Qi | ........................ | G11C 11/1693 |
| 10,200,046 B1 * | 2/2019 | Leong | .................... | H03K 5/135 |
| 10,755,756 B2 * | 8/2020 | Ma | .......................... | G11C 7/222 |
| 2006/0001465 A1 * | 1/2006 | Kwak | ................... | H03L 7/0814 327/160 |
| 2007/0030753 A1 * | 2/2007 | Kwak | ................... | H03L 7/0814 365/233.11 |
| 2007/0183227 A1 * | 8/2007 | Kim | ....................... | G11C 7/222 365/194 |
| 2007/0262798 A1 * | 11/2007 | Yun | ....................... | H03L 7/0816 327/158 |
| 2008/0164920 A1 * | 7/2008 | Cho | ....................... | H03L 7/0816 327/158 |
| 2008/0174350 A1 * | 7/2008 | Shin | ...................... | H03L 7/0816 327/158 |
| 2009/0116602 A1 * | 5/2009 | Kwon | .................. | H03L 7/0814 375/372 |

(Continued)

*Primary Examiner* — Adam D Houston
(74) *Attorney, Agent, or Firm* — William Park & Associates Ltd.

(57) ABSTRACT

A delay circuit includes a coarse delay circuit, a header circuit, and a phase mixing circuit. The coarse delay circuit is configured to delay a reference clock signal to generate a first clock signal and a second clock signal and to change each phase of the first clock signal and the second clock signal by double a unit phase. The header circuit is configured to receive the first clock signal and the second clock signal and to generate a first phase clock signal and a second phase clock signal, between which a phase difference corresponds to half of the unit phase. The phase mixing circuit is configured to mix phases of the first phase clock signal and the second phase clock signal to generate an output clock signal.

18 Claims, 7 Drawing Sheets

(56) References Cited

U.S. PATENT DOCUMENTS

| | | | |
|---|---|---|---|
| 2009/0289676 A1* | 11/2009 | Takai | H03K 5/133 327/158 |
| 2010/0182058 A1* | 7/2010 | Gomm | H03K 5/133 327/158 |
| 2010/0315147 A1* | 12/2010 | Booth | H03K 5/13 327/298 |
| 2011/0148486 A1* | 6/2011 | Mosalikanti | H03K 5/15 327/158 |
| 2011/0234280 A1* | 9/2011 | Na | H03L 7/0816 327/158 |
| 2012/0154001 A1* | 6/2012 | Seo | H03L 7/0816 327/158 |
| 2013/0229214 A1* | 9/2013 | Ichida | G11C 11/4076 327/158 |
| 2014/0002149 A1* | 1/2014 | Jang | H03L 7/0818 327/149 |
| 2014/0021990 A1* | 1/2014 | Na | H03L 7/0816 327/158 |
| 2016/0269012 A1* | 9/2016 | Takahashi | H03L 7/0814 |

* cited by examiner

DELAY CIRCUIT AND A DELAY LOCKED LOOP CIRCUIT USING THE SAME

CROSS-REFERENCES TO RELATED APPLICATION

The present application claims priority under 35 U.S.C. § 119(a) to Korean application number 10-2020-0134983, filed on Oct. 19, 2020, in the Korean Intellectual Property Office, which is incorporated herein by reference in its entirety.

BACKGROUND

1. Technical Field

Various embodiments generally relate to an integrated circuit technology, and, more particularly, to a delay circuit for delaying a signal and a delay locked loop circuit using the same.

2. Related Art

An electronic device includes many electronic elements, and a computer system includes many semiconductor apparatuses each configured by a semiconductor. The semiconductor apparatuses configuring the computer system may communicate with each other by transmitting and receiving a clock signal and data. The semiconductor apparatuses may buffer or divide a system clock signal to generate internal clock signals having various phases. Because the semiconductor apparatuses generate the internal clock signals through various internal circuits, asynchronous delay may occur. Accordingly, a phase discrepancy may occur between the internal clock signal and the system clock signal. In general, a semiconductor apparatus may include a delay locked loop circuit in order to compensate for the asynchronous delay and generate the internal clock signal having a phase in synchronization with the system clock signal.

SUMMARY

In an embodiment, a delay circuit may include a coarse delay circuit, a header circuit, and a phase mixing circuit. The coarse delay circuit may be configured to delay a reference clock signal to generate a first clock signal and a second clock signal and configured to change each phase of the first clock signal and the second clock signal by double a unit phase. The header circuit may be configured to receive the first clock signal and the second clock signal and configured to generate a first phase clock signal and a second phase clock signal, between which a phase difference corresponds to half of the unit phase. The phase mixing circuit may be configured to mix phases of the first phase clock signal and the second phase clock signal to generate an output clock signal.

In an embodiment, a delay locked loop circuit may include a coarse delay circuit, a fine delay circuit, a delay model circuit, a phase detector, and a delay control circuit. The coarse delay circuit may be configured to delay a reference clock signal to generate a first clock signal and a second clock signal, which has a phase complementary to a phase of the first clock signal, and configured to change, based on a coarse control signal, each phase of the first clock signal and the second clock signal by double a unit phase. The fine delay circuit may be configured to generate a first phase clock signal and a second phase clock signal, between which a phase difference corresponds to half of the unit phase, from the first and second clock signals and configured to mix phases of the first phase clock signal and the second phase clock signal to generate an output clock signal, based on a fine control signal. The delay model circuit may be configured to delay the output clock signal by a modelled delay time to generate a feedback clock signal. The phase detector may be configured to detect phases of the reference clock signal and the feedback clock signal to generate a phase detection signal. The delay control circuit may be configured to generate the coarse control signal and the fine control signal based on the phase detection signal.

DETAILED DESCRIPTION

Figure 1:
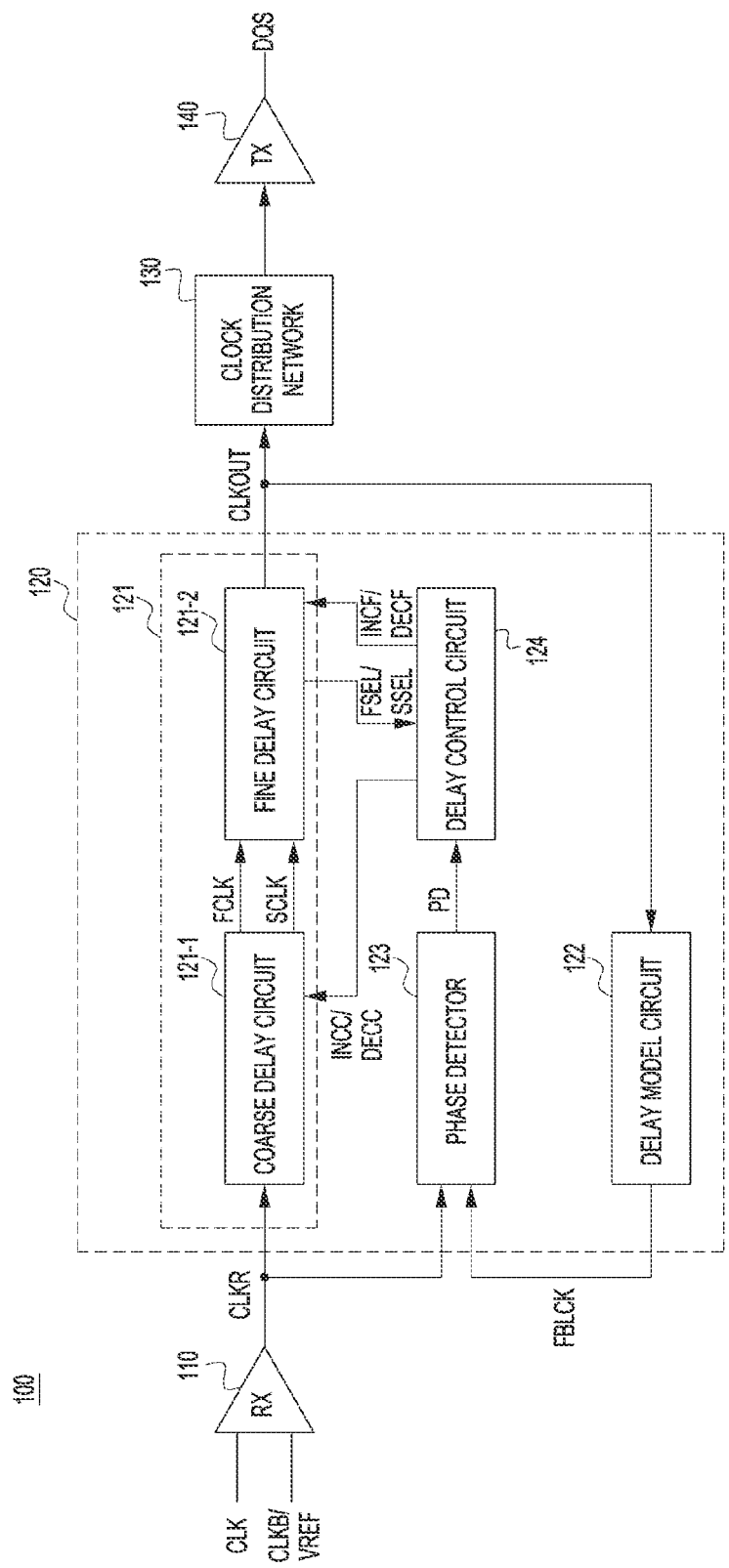
FIG. 1 is a diagram illustrating a configuration of a semiconductor apparatus in accordance with an embodiment.

FIG. 1 is a diagram illustrating a configuration of a semiconductor apparatus 100 in accordance with an embodiment. Referring to FIG. 1, the semiconductor apparatus 100 may include a clock receiver (RX) 110, a delay locked loop circuit 120, a clock distribution network 130, and a clock transmitter (TX) 140. The clock receiver 110 may receive a system clock signal CLK from an external apparatus (not illustrated). The clock receiver 110 may receive the system clock signal CLK to generate a reference clock signal CLKR. The system clock signal CLK may be a single-ended signal or a differential signal to be provided together with a complementary signal CLKB. When the system clock signal CLK is provided as a differential signal, the clock receiver 110 may differentially amplify the system clock signal CLK and the complementary signal CLKB to generate the reference clock signal CLKR.

When the system clock signal CLK is provided as a single-ended signal, the clock receiver 110 may differentially amplify the system clock signal CLK and a reference voltage VREF to generate the reference clock signal CLKR. The reference voltage VREF may have a level corresponding to a middle of a swing range of the system clock signal CLK.

The delay locked loop circuit 120 may be coupled to the clock receiver 110 and may receive the reference clock signal CLKR output from the clock receiver 110. The delay locked loop circuit 120 may perform a delay locking operation on the reference clock signal CLKR to generate an output clock signal CLKOUT. The semiconductor apparatus 100 may be synchronized with the system clock signal CLK to perform a data communication with the external apparatus. The semiconductor apparatus 100 may receive the system clock signal CLK to generate a transmission clock signal DQS and may transmit, in synchronization with the transmission clock signal DQS, data to the external apparatus. However, the system clock signal CLK may be delayed by an internal circuit of the semiconductor apparatus 100. Therefore, the semiconductor apparatus 100 compensates for a delay amount that may occur on a path from a point where the system clock signal CLK is received to a point where the transmission clock signal DQS is output. In order to compensate for the delay amount, the delay locked loop circuit 120 may variably delay the reference clock signal CLKR to generate the output clock signal CLKOUT.

The clock distribution network 130 may receive the output clock signal CLKOUT and may transmit the output clock signal CLKOUT to the clock transmitter 140. The clock transmitter 140 may drive the clock signal, which is provided from the clock distribution network 130, to output the transmission clock signal DQS to the external apparatus. Although the single clock transmitter 140 is illustrated in FIG. 1, the semiconductor apparatus 100 may include a plurality of data channels and/or pads, each of which is provided with the clock transmitter. The clock distribution network 130 may transmit the output clock signal CLKOUT, which is generated from the delay locked loop circuit 120, to each of the plurality of the clock transmitters.

The delay locked loop circuit 120 may include a delay circuit 121, a delay model circuit 122, a phase detector 123, and a delay control circuit 124. The delay circuit 121 may receive the reference clock signal CLKR and may delay the reference clock signal CLKR to generate the output clock signal CLKOUT. The delay circuit 121 may variably delay the reference clock signal CLKR based on delay control signals. The delay control signals may be control signals for changing and/or updating a delay time of the delay circuit 121. The delay circuit 121 may include a coarse delay circuit 121-1 and a fine delay circuit 121-2. The delay control signals may include coarse control signals INCC and DECC and fine control signals INCF and DECF. The delay time of the coarse delay circuit 121-1 may be set on the basis of the coarse control signals INCC and DECC. The coarse delay circuit 121-1 may receive the reference clock signal CLKR and may delay the reference clock signal CLKR by the set delay time to generate a first clock signal FCLK and a second clock signal SCLK. The second clock signal SCLK may be a complementary clock signal of the first clock signal FCLK and may have a complementary phase difference (i.e., 180°) with respect to the first clock signal FCLK. The delay time of the fine delay circuit 121-2 may be set on the basis of the fine control signals INCF and DECF. The fine delay circuit 121-2 may include a phase mixing circuit and may adjust a weight of the phase mixing circuit based on the fine control signals INCF and DECF. The fine delay circuit 121-2 may receive the first clock signal FCLK and the second clock signal SCLK and may mix phases of the first clock signal FCLK and the second clock signal SCLK based on the weight adjusted on the basis of the fine control signals INCF and DECF, to generate the output clock signal CLKOUT.

A unit delay time of the coarse delay circuit 121-1 may be longer than a unit delay time of the fine delay circuit 121-2. The delay locked loop circuit 120 may perform a coarse delay locking operation and a fine delay locking operation. The coarse delay locking operation may be an operation for setting the delay time of the coarse delay circuit 121-1 based on a phase detection result of the phase detector 123. The fine delay locking operation may be an operation for setting the delay time of the fine delay circuit 121-2 based on the phase detection result of the phase detector 123. The fine delay locking operation may be performed after completion of the coarse delay locking operation. During the fine delay locking operation, the delay time of the coarse delay circuit 121-1, which is set through the coarse delay locking operation, may be additionally changed.

A phase which is changed according to the unit delay time of the coarse delay circuit 121-1 may correspond to double a unit phase. Whenever the delay time is updated according to the coarse control signals INCC and DECC, the coarse delay circuit 121-1 may change stepwise the phases of the first clock signal FCLK and the second clock signal SCLK by an amount of double the unit phase. The fine delay circuit 121-2 may receive the first clock signal FCLK and the second clock signal SCLK, may generate two phase clock signals having a phase difference corresponding to half of the unit phase and may generate the output clock signal CLKOUT by mixing the phases of the two phase clock signals. The unit phase will be described later.

The delay model circuit 122 may receive the output clock signal CLKOUT and may delay the output clock signal CLKOUT by a modelled delay time, to generate a feedback clock signal FBCLK. For an embodiment, the modelled delay time refers to the delay time by the delay model circuit 122. The delay time of the delay model circuit 122 may be set to be substantially the same as a delay time which occurs on a clock path of the semiconductor apparatus 100. The delay model circuit 122 may have a delay amount corresponding to the delay amount which occurs traversing a path from a point where the system clock signal CLK is received to a point where the transmission clock signal DQS is output. The delay model circuit 122 may include circuits and/or elements, which are modelled on circuits existing on the path from a point where the system clock signal CLK is received to a point where the transmission clock signal DQS is output.

The phase detector 123 may receive the reference clock signal CLKR and the feedback clock signal FBCLK. The phase detector 123 may detect the phases of the reference clock signal CLKR and the feedback clock signal FBCLK to generate a phase detection signal PD. For example, the phase detector 123 may compare the reference clock signal CLKR with the feedback clock signal FBCLK to determine whether the reference clock signal CLKR has a phase leading or lagging behind the feedback clock signal FBCLK. When the reference clock signal CLKR has a phase leading the feedback clock signal FBCLK, the phase detector 123 may generate the phase detection signal PD having a first logic level. When the reference clock signal CLKR has a phase lagging behind the feedback clock signal FBCLK, the phase detector 123 may generate the phase detection signal PD having a second logic level. For example, the first logic level may be a high logic level and the second logic level may be a low logic level.

The delay control circuit 124 may receive the phase detection signal PD from the phase detector 123. The delay control circuit 124 may generate the delay control signal based on the phase detection signal PD. The delay control circuit 124 may generate the coarse control signals INCC and DECC based on the phase detection signal PD during the coarse delay locking operation and may generate the fine control signals INCF and DECF based on the phase detection signal PD during the fine delay locking operation. The coarse control signals INCC and DECC may include a coarse increase signal INCC and a coarse decrease signal DECC. The coarse increase signal INCC may be a signal for increasing the delay time of the coarse delay circuit 121-1. The coarse decrease signal DECC may be a signal for decreasing the delay time of the coarse delay circuit 121-1. The coarse delay circuit 121-1 may increase an amount of time by which the reference clock signal CLKR is delayed based on the coarse increase signal INCC. Each phase of the first clock signal FCLK and the second clock signal SCLK may be delayed by an amount of double the unit phase. The coarse delay circuit 121-1 may decrease an amount of time by which the reference clock signal CLKR is delayed based on the coarse decrease signal DECC. Each phase of the first clock signal FCLK and the second clock signal SCLK may advance by an amount of double the unit phase. The fine control signals INCF and DECF may include a fine increase signal INCF and a fine decrease signal DECF. Based on the fine increase signal INCF and the fine decrease signal DECF, the fine delay circuit 121-2 may change the weight for mixing the phases of the first clock signal FCLK and the second clock signal SCLK.

Based on the fine increase signal INCF and the fine decrease signal DECF, the fine delay circuit 121-2 may generate a first clock selecting signal FSEL and a second clock selecting signal SSEL. As previously described, the fine delay circuit 121-2 may receive the first clock signal FCLK and the second clock signal SCLK and may generate, from the first clock signal FCLK and the second clock signal SCLK, the two phase clock signals having the phase difference corresponding to half of the unit phase. Based on the first clock selecting signal FSEL and the second clock selecting signal SSEL, the delay control circuit 124 may generate the coarse increase signal INCC and the coarse decrease signal DECC. Based on the first clock selecting signal FSEL and the second clock selecting signal SSEL, the delay control circuit 124 may generate the coarse increase signal INCC and the coarse decrease signal DECC to continuously change the phase of the output clock signal CLKOUT generated from the fine delay circuit 121-2 by half of the unit phase.

Figure 2:
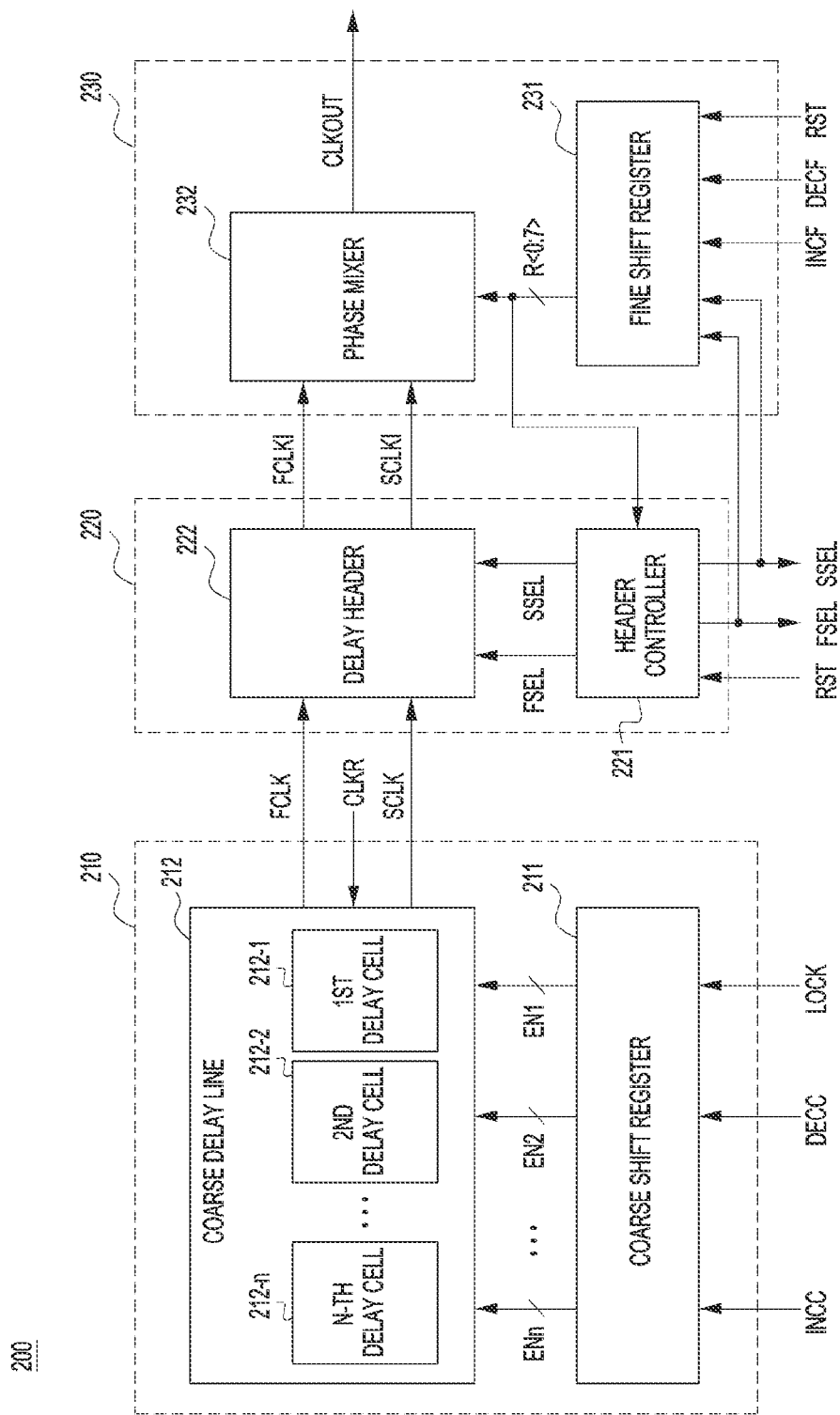
FIG. 2 is a diagram illustrating a configuration of a delay circuit in accordance with an embodiment.

FIG. 2 is a diagram illustrating a configuration of a delay circuit 200 in accordance with an embodiment. The delay circuit 200 may be applied as the delay circuit 121 illustrated in FIG. 1. Referring to FIG. 2, the delay circuit 200 may include a coarse delay circuit 210, a header circuit 220, and a phase mixing circuit 230. The header circuit 220 and the phase mixing circuit 230 may configure the fine delay circuit 121-2. The coarse delay circuit 210 may include a coarse shift register 211 and a coarse delay line 212. Based on the coarse control signals INCC and DECC, the coarse shift register 211 may generate first to n-th enable signals EN1 to ENn, 'n' being 3 or a greater integer. The number of the first to n-th enable signals EN1 to ENn may correspond to the number of delay cells provided within the coarse delay line 212. When receiving the coarse increase signal INCC, the coarse shift register 211 may increase the number of enable signals to be enabled among the first to n-th enable signals EN1 to ENn. When receiving the coarse decrease signal DECC, the coarse shift register 211 may decrease the number of enable signals to be enabled among the first to n-th enable signals EN1 to ENn. The coarse shift register 211 may sequentially increase or decrease the number of enable signals to be enabled among the first to n-th enable signals EN1 to ENn. For example, the coarse shift register 211 might enable only the first enable signal EN1 in an initial state. When receiving the coarse increase signal INCC, the coarse shift register 211 may enable the second enable signal EN2 together with the first enable signal EN1. Whenever receiving the coarse increase signal INCC, the coarse shift register 211 increases one by one the number of enable signals to be enabled among the first to n-th enable signals EN1 to ENn. Whenever receiving the coarse decrease signal DECC, the coarse shift register 211 decrease one by one the number of enable signals to be enabled among the first to n-th enable signals EN1 to ENn.

The coarse delay line 212 may receive the reference clock signal CLKR and may delay the reference clock signal CLKR to generate the first clock signal FCLK and the second clock signal SCLK. The coarse delay line 212 may include first to n-th delay cells 212-1 to 212-n. Each of the first to n-th delay cells 212-1 to 212-n may have a delay time corresponding to the unit delay time of the coarse delay line 212. The delay time of the coarse delay line 212 may change according to the number of delay cells to be activated. The delay time of a single delay cell may correspond to double of the unit phase. Based on the first to n-th enable signals EN1 to ENn, the coarse delay line 212 may change the number of delay cells to be activated. The first delay cell 212-1 may be activated on the basis of the first enable signal EN1. The second delay cell 212-2 may be activated on the basis of the second enable signal EN2. The n-th delay cell 212-n may be activated on the basis of the n-th enable signal ENn. The first delay cell 212-1 may receive the reference clock signal CLKR and may output the first clock signal FCLK and the second clock signal SCLK. As the second to n-th delay cells 212-2 to 212-n are sequentially activated, a path that the reference clock signal CLKR travels may become longer and therefore a delay time of the reference clock signal CLKR may increase. As the second to n-th delay cells 212-2 to 212-n are sequentially deactivated, the path that the reference clock signal CLKR travels may become shorter and therefore the delay time of the reference clock signal CLKR may decrease.

As described later, each of the first to n-th enable signals EN1 to ENn may include an up-enable signal and a down-enable signal. The up-enable signal may be a signal for increasing an amount of time required for the reference clock signal CLKR to be output as the first clock signal FCLK. The down-enable signal may be a signal for increasing an amount of time required for the reference clock signal CLKR to be output as the second clock signal SCLK. During the coarse delay locking operation, the coarse shift register 211 enables or disables all the up-enable signals and the down-enable signals based on the coarse increase signal INCC and the coarse decrease signal DECC. During the fine delay locking operation, the coarse shift register 211 enables or disables, one by one and sequentially, the up-enable signals and the down-enable signals based on the coarse increase signal INCC and the coarse decrease signal DECC. For example, it is assumed that only the first enable signal EN1 is enabled through the coarse delay locking operation. When receiving the coarse increase signal INCC during the fine delay locking operation, the coarse shift register 211 may first enable the up-enable signal of the second enable signal EN2. When receiving the coarse increase signal INCC again, the coarse shift register 211 may then enable the down-enable signal of the second enable signal EN2. When receiving the coarse decrease signal DECC during the fine delay locking operation, the coarse shift register 211 may first disable the down-enable signal of the first enable signal EN1. When receiving the coarse decrease signal DECC again, the coarse shift register 211 may then disable the up-enable signal of the first enable signal EN1. The coarse shift register 211 may further receive a locking signal LOCK. The locking signal LOCK may be enabled when the coarse delay locking operation is completed. Therefore, the coarse delay locking operation may be performed while the locking signal LOCK is disabled, and the fine delay locking operation may be performed while the locking signal LOCK is enabled. When the locking signal LOCK is disabled, the coarse shift register 211 may enable or disable all the up-enable signals and the down-enable signals based on the coarse increase signal INCC and the coarse decrease signal DECC. When the locking signal LOCK is enabled, the coarse shift register 211 enables or disables, one by one and sequentially, the up-enable signals and the down-enable signals based on the coarse increase signal INCC and the coarse decrease signal DECC.

The header circuit 220 may receive the first clock signal FCLK and the second clock signal SCLK and may generate a first phase clock signal FCLKI and a second phase clock signal SCLKI from the first clock signal FCLK and the second clock signal SCLK. A phase difference between the first phase clock signal FCLKI and the second phase clock signal SCLKI may correspond to half of the unit phase. Based on the fine increase signal INCF and the fine decrease signal DECF, the header circuit 220 may generate the first phase clock signal FCLKI having a phase leading the second phase clock signal SCLKI by an amount of half of the unit phase or may generate the first phase clock signal FCLKI having a phase lagging behind the second phase clock signal SCLKI by an amount of half of the unit phase.

The phase mixing circuit 230 may receive the first phase clock signal FCLKI, the second phase clock signal SCLKI, the fine increase signal INCF, and the fine decrease signal DECF. Based on the fine increase signal INCF and the fine decrease signal DECF, the phase mixing circuit 230 may determine the weight R<0:7> for mixing the phases of the first phase clock signal FCLKI and the second phase clock signal SCLKI. According to the weight R<0:7>, the phase mixing circuit 230 may mix the phases of the first phase clock signal FCLKI and the second phase clock signal SCLKI to generate the output clock signal CLKOUT. For example, the phase mixing circuit 230 may generate the output clock signal CLKOUT having a phase close to the phase of the first phase clock signal FCLKI as a value of the weight R<0:7> becomes greater and may generate the output clock signal CLKOUT having a phase close to the phase of the second phase clock signal SCLKI as the value of the weight R<0:7> becomes smaller.

The header circuit 220 may include a header controller 221 and a delay header 222. The header controller 221 may receive the weight R<0:7> determined on the basis of the fine increase signal INCF and the fine decrease signal DECF. Based on the weight R<0:7>, the header controller 221 may generate the first clock selecting signal FSEL and the second clock selecting signal SSEL. The header controller 221 may provide the delay header 222 with the first clock selecting signal FSEL and the second clock selecting signal SSEL. Referring to FIGS. 1 and 2, the header controller 221 may provide the delay control circuit 124 with the first clock selecting signal FSEL and the second clock selecting signal SSEL. Whenever the weight R<0:7> has its maximum value, the header controller 221 may change a logic level of the first clock selecting signal FSEL to its opposite logic level. Whenever the weight R<0:7> has its minimum value, the header controller 221 may change a logic level of the second clock selecting signal SSEL to its opposite logic level. The header controller 221 may further receive a reset signal RST. Based on the reset signal RST, the header controller 221 may initialize the first clock selecting signal FSEL and the second clock selecting signal SSEL to have a first logic level. The reset signal RST may be enabled when the coarse delay locking operation is completed and the fine delay locking operation starts.

In the initial state, each of the first clock selecting signal FSEL and the second clock selecting signal SSEL may have the first logic level. When any one of the first clock selecting signal FSEL and the second clock selecting signal SSEL transitions from a second logic level to the first logic level, the delay control circuit 124 may generate the coarse increase signal INCC and the coarse decrease signal DECC. When any one of the first clock selecting signal FSEL and the second clock selecting signal SSEL transitions from the second logic level to the first logic level and the phase detection signal PD has a first logic level, the delay control circuit 124 may generate the coarse increase signal INCC, and the coarse delay circuit 210 may increase the delay time of the coarse delay line 212. When any one of the first clock selecting signal FSEL and the second clock selecting signal SSEL transitions from the second logic level to the first logic level and the phase detection signal PD has a second logic level, the delay control circuit 124 may generate the coarse decrease signal DECC, and the coarse delay circuit 210 may decrease the delay time of the coarse delay line 212.

The delay header 222 may receive the first clock signal FCLK and the second clock signal SCLK from the coarse delay circuit 210 and may receive the first clock selecting signal FSEL and the second clock selecting signal SSEL from the header controller 221. Based on the first clock selecting signal FSEL, the delay header 222 may generate the first phase clock signal FCLKI from one of the first clock signal FCLK and a first delayed clock signal, which is the first clock signal FCLK delayed by an amount of the unit phase. Based on the second clock selecting signal SSEL, the delay header 222 may generate the second phase clock signal SCLKI from one of an inverted clock signal, which is the second clock signal SCLK inversely driven, and a second delayed clock signal, which is the inverted clock signal delayed by an amount of the unit phase.

The phase mixing circuit 230 may include a fine shift register 231 and a phase mixer 232. The fine shift register 231 may receive the fine increase signal INCF and the fine decrease signal DECF to generate the weight R<0:7>. Based on the fine increase signal INCF and the fine decrease signal DECF, the fine shift register 231 may change the weight R<0:7>. The fine shift register 231 may decrease or increase the value of the weight R<0:7> stepwise based on the fine increase signal INCF and may increase or decrease the value of the weight R<0:7> stepwise based on the fine decrease signal DECF. The weight R<0:7> may be a digital signal having a plurality of bits. The logic value of the weight R<0:7> may be increased or decreased in the same way as a thermometer code. If the fine increase signal INCF is continuously generated a number of times corresponding to a number exceeding the number of bits of the weight R<0:7>, the fine shift register 231 may decrease the weight R<0:7>, and when the weight R<0:7> reaches its minimum value, the fine shift register 231 may increase the weight R<0:7> again. If the fine decrease signal DECF is continuously generated a number of times corresponding to a number exceeding the number of bits of the weight R<0:7>, the fine shift register 231 may increase the weight R<0:7>, and when the weight R<0:7> reaches its maximum value, the fine shift register 231 may decrease the weight R<0:7> again.

The fine shift register 231 may further receive the reset signal RST. Based on the reset signal RST, the fine shift register 231 may initialize the weight R<0:7>. For example, when the reset signal RST is enabled, the fine shift register 231 may initialize the weight R<0:7> to have its maximum value. The fine shift register 231 may further receive the first clock selecting signal FSEL and the second clock selecting signal SSEL from the header controller 221. The fine shift register 231 may change the value of the weight R<0:7> based on the fine increase signal INCF, the fine decrease signal DECF, the first clock selecting signal FSEL, and the second clock selecting signal SSEL. For example, when the first clock selecting signal FSEL is enabled, the fine shift register 231 may decrease the value of the weight R<0:7> based on the fine increase signal INCF. For example, when the first clock selecting signal FSEL is disabled, the fine shift register 231 may increase the value of the weight R<0:7> based on the fine increase signal INCF. For example, when the second clock selecting signal SSEL is enabled, the fine shift register 231 may increase the value of the weight R<0:7> based on the fine decrease signal DECF. For example, when the second clock selecting signal SSEL is disabled, the fine shift register 231 may decrease the value of the weight R<0:7> based on the fine decrease signal DECF.

The phase mixer 232 may receive the first phase clock signal FCLKI and the second phase clock signal SCLKI from the header circuit 220 and the weight R<0:7> from the fine shift register 231. Based on the weight R<0:7>, the phase mixer 232 may mix the phases of the first phase clock signal FCLKI and the second phase clock signal SCLKI to generate the output clock signal CLKOUT. The phase mixer 232 may include any known phase mixer configured to mix, according to a weight, phases of two input clock signals to generate an output clock signal.

Figure 3:
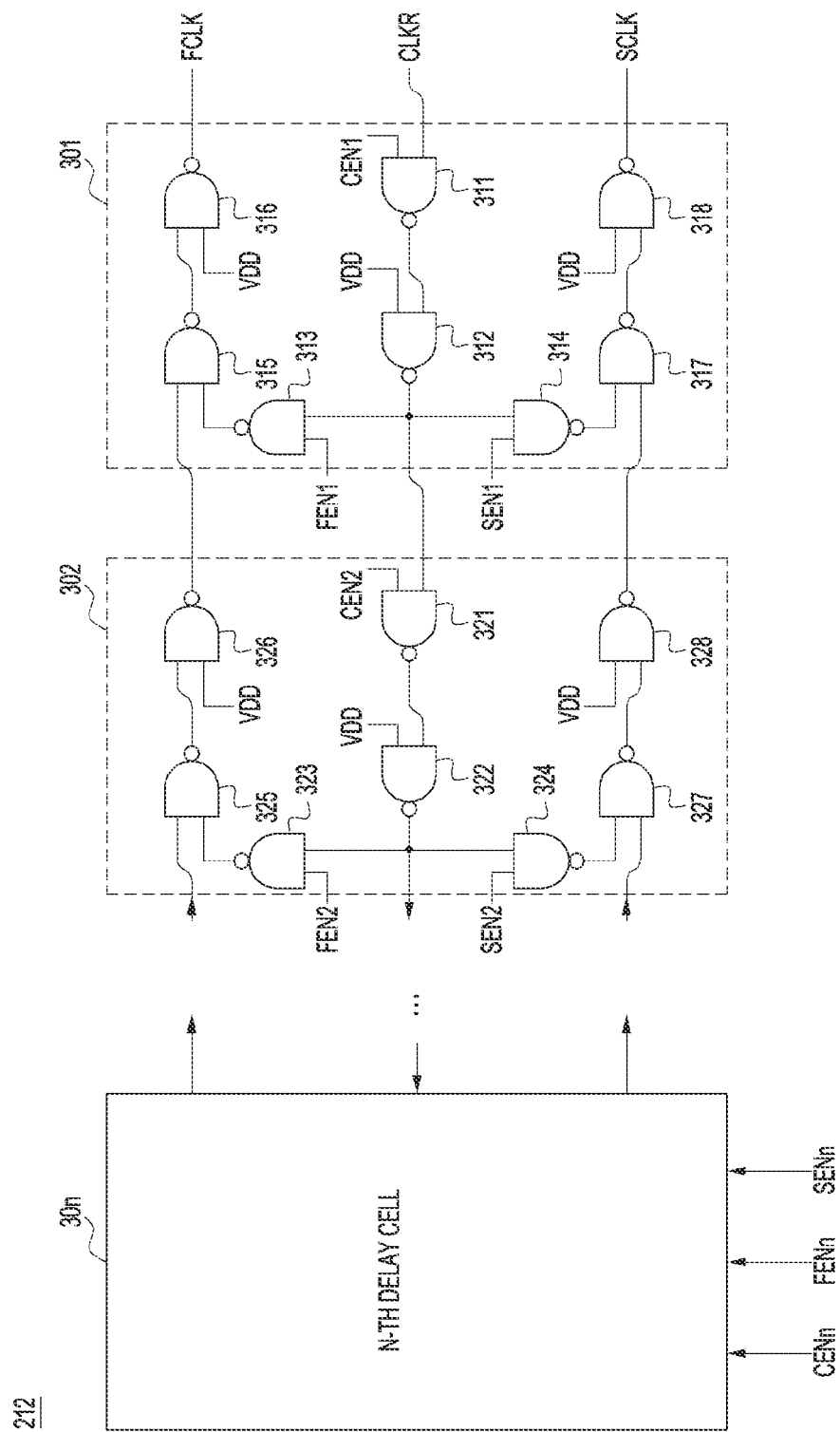
FIG. 3 is a diagram illustrating a configuration of a coarse delay line illustrated in FIG. 2.

FIG. 3 is a diagram illustrating a configuration of the coarse delay line 212 illustrated in FIG. 2. Referring to FIG. 3, the coarse delay line 212 may include first to n-th delay cells 301 to 30n. The first delay cell 301 may receive the reference clock signal CLKR, and the first to n-th delay cells 301 to 30n may sequentially delay the reference clock signal CLKR. Each of the first to n-th delay cells 301 to 30n may include eight NAND gates. Each of the first to n-th enable signals EN1 to ENn may include a plurality of enable signals. Each of the first to n-th enable signals EN1 to ENn may include a cell enable signal, the up-enable signal and the down-enable signal.

The first delay cell 301 may include first to eighth NAND gates 311 to 318. The first NAND gate 311 may receive a first cell enable signal CEN1 and the reference clock signal CLKR. The second NAND gate 312 may receive an output of the first NAND gate 311 and a power voltage VDD. The power voltage VDD may have a voltage level sufficient to be determined as a high logic level. The third NAND gate 313 may receive an output of the second NAND gate 312 and a first up-enable signal FEN1. The fourth NAND gate 314 may receive an output of the second NAND gate 312 and a first down-enable signal SEN1. The fifth NAND gate 315 may receive an output of the third NAND gate 313 and a signal output from the second delay cell 302. The sixth NAND gate 316 may receive an output of the fifth NAND gate 315 and the power voltage VDD and may output the first clock signal FCLK. The seventh NAND gate 317 may receive an output of the fourth NAND gate 314 and the signal output from the second delay cell 302. The eighth NAND gate 318 may receive an output of the seventh NAND gate 317 and the power voltage VDD and may output the second clock signal SCLK.

The second delay cell 302 may include first to eighth NAND gates 321 to 328. The first NAND gate 321 may receive a second cell enable signal CEN2 and the output of the second NAND gate 312 of the first NAND gate 311. The second NAND gate 322 may receive an output of the first NAND gate 321 and the power voltage VDD. The third NAND gate 323 may receive an output of the second NAND gate 322 and a second up-enable signal FEN2. The fourth NAND gate 324 may receive an output of the second NAND gate 322 and a second down-enable signal SEN2. The fifth NAND gate 325 may receive an output of the third NAND gate 323 and a signal output from the delay cell disposed at the next stage. The sixth NAND gate 326 may receive an output of the fifth NAND gate 325 and the power voltage VDD and may output the signal input to the fifth NAND gate 315 of the first delay cell 301. The seventh NAND gate 327 may receive an output of the fourth NAND gate 324 and the signal output from the delay cell disposed at the next stage. The eighth NAND gate 328 may receive an output of the seventh NAND gate 327 and the power voltage VDD and may output the signal input to the seventh NAND gate 317 of the first delay cell 301. The n-th delay cell 30n may have the same structure as each of the first delay cell 301 and the second delay cell 302 except that each of seventh and eighth NAND gates receives the power voltage VDD instead of the signal output from the delay cell disposed at the next stage.

Referring to FIGS. 2 and 3, when the first enable signal EN1 is enabled and the second to n-th enable signals EN2 to ENn are disabled by the coarse shift register 211, the first cell enable signal CEN1, the first up-enable signal FEN1, and the first down-enable signal SEN1 may be enabled. Therefore, the reference clock signal CLKR may be delayed only by the first delay cell 301. The reference clock signal CLKR may be output as the first clock signal FCLK sequentially through the first NAND gate 311, the second NAND gate 312, the third NAND gate 313, the fifth NAND gate 315, and the sixth NAND gate 316. The reference clock signal CLKR may be output as the second clock signal SCLK sequentially through the first NAND gate 311, the second NAND gate 312, the fourth NAND gate 314, the seventh NAND gate 317, and the eighth NAND gate 318. When the second enable signal EN2 is also enabled by the coarse shift register 211, the second cell enable signal CEN2, the second up-enable signal FEN2, and the second down-enable signal SEN2 may also be enabled. Therefore, the reference clock signal CLKR may be delayed by the first delay cell 301 and the second delay cell 302. The reference clock signal CLKR may be output as the first clock signal FCLK sequentially through the first NAND gate 311 and the second NAND gate 312 of the first delay cell 301 and the first NAND gate 321, the second NAND gate 322, the third NAND gate 323, the fifth NAND gate 325, and the sixth NAND gate 326 of the second delay cell 302, and the fifth NAND gate 315 and the sixth NAND gate 316 of the first delay cell 301. The reference clock signal CLKR may be output as the second clock signal SCLK sequentially through the first NAND gate 311 and the second NAND gate 312 of the first delay cell 301 and the first NAND gate 321, the second NAND gate 322, the fourth NAND gate 324, the seventh NAND gate 327, and the eighth NAND gate 328 of the second delay cell 302, and the seventh NAND gate 317 and the eighth NAND gate 318 of the first delay cell 301. The reference clock signal CLKR may be delayed by the five NAND gates of the first delay cell 301 to be output as the first clock signal FCLK and the second clock signal SCLK. The reference clock signal CLKR may be delayed by the nine NAND gates of the first delay cell 301 and the second delay cell 302 to be output as the first clock signal FCLK and the second clock signal SCLK. Therefore, the unit delay time of each of the first to n-th delay cells 301 to 30n may be an amount of a 4-gate delay. The unit phase may be an amount of a 2-gate delay. An amount of phase that is changed within the unit delay time of each of the first to n-th delay cells 301 to 30n may be double the unit phase. As a number of activated delay cells increases one by one, the delay time of the reference clock signal CLKR may increase by an amount of a 4-gate delay. As a number of activated delay cells decreases one by one, the delay amount of the reference clock signal CLKR may decrease by an amount of a 4-gate delay.

Figure 4:
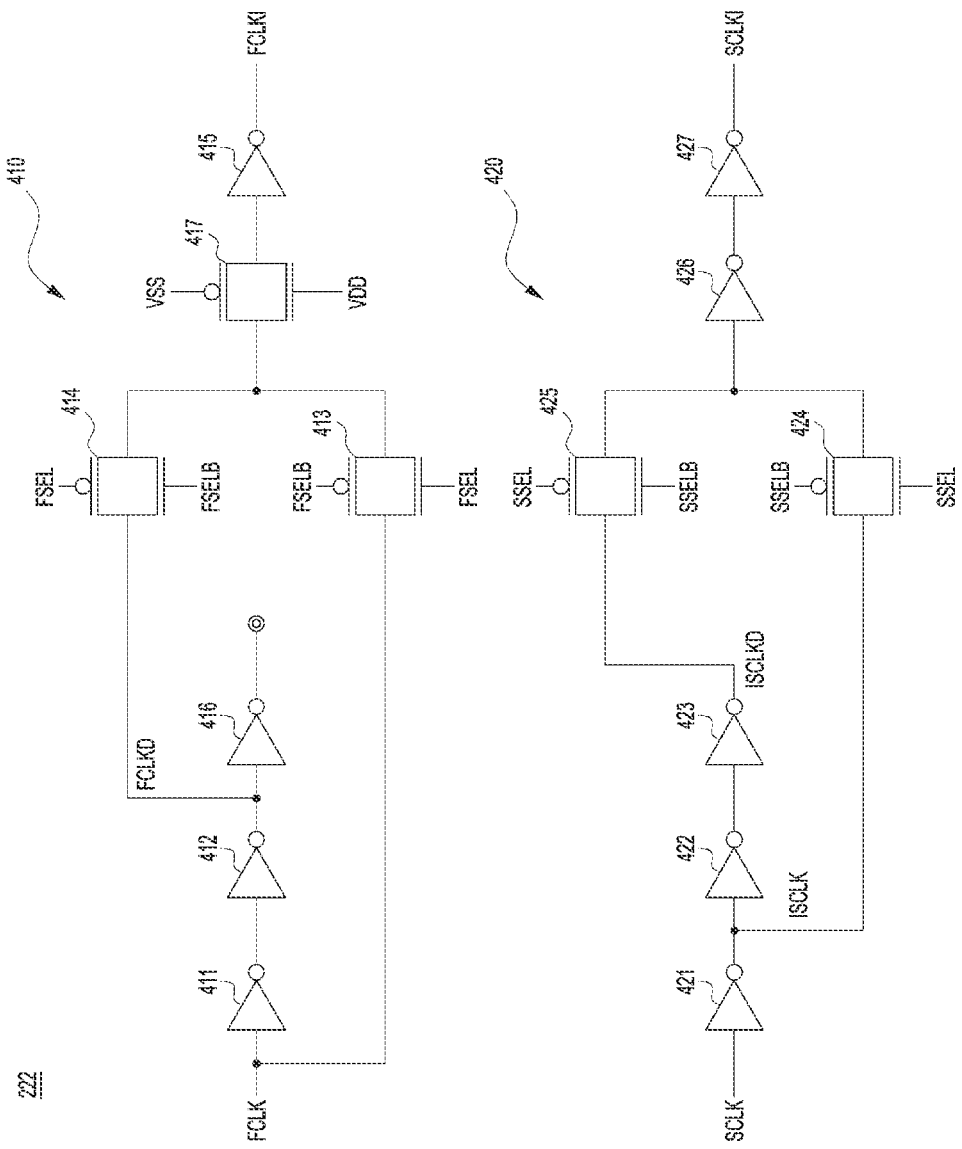
FIG. 4 is a diagram illustrating a configuration of a delay header illustrated in FIG. 2.

FIG. 4 is a diagram illustrating a configuration of the delay header 222 illustrated in FIG. 2. Referring to FIG. 4, the delay header 222 may include a first clock selecting circuit 410 and a second clock selecting circuit 420. The first clock selecting circuit 410 may receive the first clock signal FCLK and the first clock selecting signal FSEL to generate the first phase clock signal FCLKI. The first clock selecting circuit 410 may delay the first clock signal FCLK by an amount of the unit phase to generate a first delayed clock signal FCLKD. According to the first clock selecting signal FSEL, the first clock selecting circuit 410 may generate the first phase clock signal FCLKI based on one of the first clock signal FCLK and the first delayed clock signal FCLKD. When the first clock selecting signal FSEL is enabled to a first logic level, the first clock selecting circuit 410 may generate the first phase clock signal FCLKI based on the first clock signal FCLK. When the first clock selecting signal FSEL is disabled to a second logic level, the first clock selecting circuit 410 may generate the first phase clock signal FCLKI based on the first delayed clock signal FCLKD.

The second clock selecting circuit 420 may receive the second clock signal SCLK and the second clock selecting signal SSEL. The second clock selecting circuit 420 may generate an inverted clock signal ISCLK by inversely driving the second clock signal SCLK. The inverted clock signal ISCLK may have a phase lagging behind the first clock signal FCLK by an amount of half of the unit phase. The second clock selecting circuit 420 may generate a second delayed clock signal ISCLKD by delaying the inverted clock signal ISCLK by an amount of the unit phase. According to the second clock selecting signal SSEL, the second clock selecting circuit 420 may generate the second phase clock signal SCLKI based on one of the inverted clock signal ISCLK and the second delayed clock signal ISCLKD.

The first clock selecting circuit 410 may include a first inverter 411, a second inverter 412, a first pass gate 413, a second pass gate 414, and a third inverter 415. The first inverter 411 may inversely drive the first clock signal FCLK. The second inverter 412 may inversely drive an output of the first inverter 411 to generate the first delayed clock signal FCLKD. Because the first delayed clock signal FCLKD is delayed through the first inverter 411 and the second inverter 412, the first delayed clock signal FCLKD may be generated by delaying the first clock signal FCLK by an amount of a 2-gate delay. The amount of a 2-gate delay may correspond to the unit phase. The first pass gate 413 may output the first clock signal FCLK based on the first clock selecting signal FSEL. The first pass gate 413 may receive the first clock selecting signal FSEL and a complementary signal FSELB of the first clock selecting signal FSEL. When the first clock selecting signal FSEL is enabled to a high logic level, the first pass gate 413 may output the first clock signal FCLK. When the first clock selecting signal FSEL is disabled to a low logic level, the first pass gate 413 may block the output of the first clock signal FCLK. The second pass gate 414 may output the first delayed clock signal FCLKD based on the first clock selecting signal FSEL. The second pass gate 414 may receive the first clock selecting signal FSEL and the complementary signal FSELB of the first clock selecting signal FSEL. When the first clock selecting signal FSEL is disabled to a low logic level, the second pass gate 414 may output the first delayed clock signal FCLKD. When the first clock selecting signal FSEL is enabled to a high logic level, the second pass gate 414 may block the output of the first delayed clock signal FCLKD. The third inverter 415 may be coupled to each of the first pass gate 413 and the second pass gate 414. The third inverter 415 may inversely drive an output of each of the first pass gate 413 and the second pass gate 414 to generate the first phase clock signal FCLKI. Because the first pass gate 413 outputs the first clock signal FCLK when the first clock selecting signal FSEL is enabled, the third inverter 415 may inversely drive the first clock signal FCLK to generate the first phase clock signal FCLKI. Because the second pass gate 414 outputs the first delayed clock signal FCLKD when the first clock selecting signal FSEL is disabled, the third inverter 415 may inversely drive the first delayed clock signal FCLKD to generate the first phase clock signal FCLKI.

The first clock selecting circuit 410 may further include a dummy inverter 416 and a dummy pass gate 417. The dummy inverter 416 may receive the first delayed clock signal FCLKD output from the second inverter 412. An output node of the dummy inverter 416 may be floated. The dummy inverter 416 may be provided to match loads of the second clock selecting circuit 420, which will be described later, and the first clock selecting circuit 410. The dummy pass gate 417 may receive an output of each of the first pass gate 413 and the second pass gate 414 and may provide the third inverter 415 with the output of each of the first pass gate 413 and the second pass gate 414. The dummy pass gate 417 may receive the power voltage VDD and a ground voltage VSS to stay turned on. The dummy pass gate 417 may be provided to match the loads of the second clock selecting circuit 420, which will be described later, and the first clock selecting circuit 410.

The second clock selecting circuit 420 may include a first inverter 421, a second inverter 422, a third inverter 423, a first pass gate 424, a second pass gate 425, a fourth inverter 426, and a fifth inverter 427. The first inverter 421 may inversely drive the second clock signal SCLK to generate the inverted clock signal ISCLK. Because the inverted clock signal ISCLK is generated through the first inverter 421, the inverted clock signal ISCLK may be generated by delaying the second clock signal SCLK by an amount of a 1-gate delay. The inverted clock signal ISCLK may have phase difference corresponding to an amount of a 1-gate delay with respect to the first clock signal FCLK. The second inverter 422 may receive the inverted clock signal ISCLK output from the first inverter 421 and may inversely drive the inverted clock signal ISCLK. The third inverter 423 may inversely drive an output of the second inverter 422 to generate the second delayed clock signal ISCLKD. The first pass gate 424 may output the inverted clock signal ISCLK based on the second clock selecting signal SSEL. The first pass gate 424 may receive the second clock selecting signal SSEL and a complementary signal SSELB of the second clock selecting signal SSEL. When the second clock selecting signal SSEL is enabled to a high logic level, the first pass gate 424 may output the inverted clock signal ISCLK. When the second clock selecting signal SSEL is disabled to a low logic level, the first pass gate 424 may block the output of the inverted clock signal ISCLK. The second pass gate 425 may output the second delayed clock signal ISCLKD based on the second clock selecting signal SSEL. The second pass gate 425 may receive the second clock selecting signal SSEL and the complementary signal SSELB of the second clock selecting signal SSEL. When the second clock selecting signal SSEL is disabled to a low logic level, the second pass gate 425 may output the second delayed clock signal ISCLKD. When the second clock selecting signal SSEL is enabled to a high logic level, the second pass gate 425 may block the output of the second delayed clock signal ISCLKD. The fourth inverter 426 may be coupled to each of the first pass gate 424 and the second pass gate 425. The fourth inverter 426 may inversely drive an output of each of the first pass gate 424 and the second pass gate 425. The fifth inverter 427 may inversely drive an output of the fourth inverter 426 to generate the second phase clock signal SCLKI. Because the first pass gate 424 outputs the inverted clock signal ISCLK when the second clock selecting signal SSEL is enabled, the fourth inverter 426 and the fifth inverter 427 may inversely drive, sequentially, the inverted clock signal ISCLK to generate the second phase clock signal SCLKI. Because the second pass gate 425 outputs the second delayed clock signal ISCLKD when the second clock selecting signal SSEL is disabled, the fourth inverter 426 and the fifth inverter 427 may inversely drive, sequentially, the second delayed clock signal ISCLKD to generate the second phase clock signal SCLKI. In order to be matched with a load caused by the third inverter 423 and the fourth inverter 426 of the second clock selecting circuit 420, the first clock selecting circuit 410 may be provided with the dummy inverter 416 and the dummy pass gate 417.

When both the first clock selecting signal FSEL and the second clock selecting signal SSEL are enabled, the first clock selecting circuit 410 may generate the first phase clock signal FCLKI from the first clock signal FCLK, and the second clock selecting circuit 420 may generate the second phase clock signal SCLKI from the inverted clock signal ISCLK. Therefore, the first phase clock signal FCLKI may have a phase leading the second phase clock signal SCLKI by an amount of a 1-gate delay (i.e., by half of the unit phase). When the first clock selecting signal FSEL is disabled, the first clock selecting circuit 410 may generate the first phase clock signal FCLKI from the first delayed clock signal FCLKD, and the second clock selecting circuit 420 may generate the second phase clock signal SCLKI from the inverted clock signal ISCLK. Therefore, the first phase clock signal FCLKI may have a phase lagging behind the second phase clock signal SCLKI by an amount of a 1-gate delay (i.e., by half of the unit phase). When the second clock selecting signal SSEL is disabled, the first clock selecting circuit 410 may generate the first phase clock signal FCLKI from the first delayed clock signal FCLKD, and the second clock selecting circuit 420 may generate the second phase clock signal SCLKI from the second delayed clock signal ISCLKD. Therefore, the first phase clock signal FCLKI may again have the phase leading the second phase clock signal SCLKI by an amount of a 1-gate delay (i.e., by half of the unit phase). The delay header 222 may generate the first phase clock signal FCLKI and the second phase clock signal SCLKI having the phase difference corresponding to half of the unit phase thereby increasing a resolution of the phase mixing circuit 230.

Figure 5:
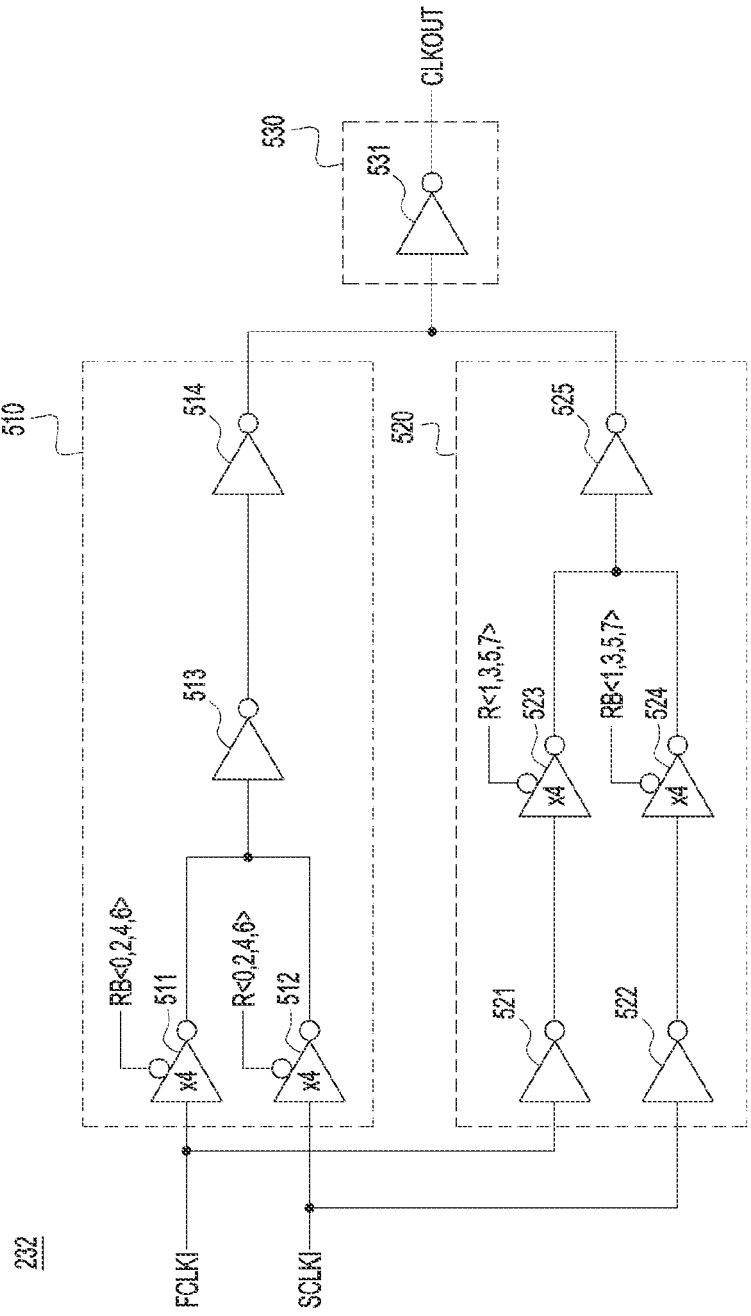
FIG. 5 is a diagram illustrating a configuration of a phase mixer illustrated in FIG. 2.

FIG. 5 is a diagram illustrating a configuration of the phase mixer 232 illustrated in FIG. 2. The phase mixer 232 may include a first mixer 510, a second mixer 520, and an output mixer 530. The first mixer 510 may receive the first phase clock signal FCLKI and the second phase clock signal SCLKI. The first mixer 510 may mix the phases of the first phase clock signal FCLKI and the second phase clock signal SCLKI based on the weight R<0:7>. The first mixer 510 may mix the phases of the first phase clock signal FCLKI and the second phase clock signal SCLKI based on partial bits of the weight R<0:7>. For example, the first mixer 510 may mix the phases of the first phase clock signal FCLKI and the second phase clock signal SCLKI based on odd bits (i.e., first, third, fifth, and seventh bits R<0,2,4,6>) of the weight R<0:7>. The second mixer 520 may receive the first phase clock signal FCLKI and the second phase clock signal SCLKI. The second mixer 520 may inversely drive the first phase clock signal FCLKI and the second phase clock signal SCLKI. The second mixer 520 may mix the phases of the inversely driven first phase clock signal FCLKI and the inversely driven second phase clock signal SCLKI based on the weight R<0:7>. The second mixer 520 may mix the phases of the inversely driven first phase clock signal FCLKI and the inversely driven second phase clock signal SCLKI based on partial bits of the weight R<0:7>. For example, the second mixer 520 may mix the phases of the inversely driven first phase clock signal FCLKI and the inversely driven second phase clock signal SCLKI based on even bits (i.e., second, fourth, sixth, and eighth bits R<1,3,5,7>) of the weight R<0:7>. The output mixer 530 may receive outputs of the first mixer 510 and the second mixer 520. The output mixer 530 may mix the phases of the outputs of the first mixer 510 and the second mixer 520 to generate the output clock signal CLKOUT. The output mixer 530 may mix, one to one, the phases of the outputs of the first mixer 510 and the second mixer 520 to generate the output clock signal CLKOUT.

The first mixer 510 may include a first mixing driver 511, a second mixing driver 512, a first inverter 513, and a second inverter 514. Each of the first mixing driver 511 and the second mixing driver 512 may include a plurality of inverters configured to individual bits of the weight R<0:7>. When the weight R<0:7> has eight bits, each of the first mixing driver 511 and the second mixing driver 512 may include four inverters configured to respectively receive odd bits R<0,2,4,6> of the weight R<0:7>. The first mixing driver 511 may receive inverted signals RB<0,2,4,6> of the odd bits R<0,2,4,6>. The first mixing driver 511 may adjust its drivability of inversely driving the first phase clock signal FCLKI. The second mixing driver 512 may receive the odd bits R<0,2,4,6>. The second mixing driver 512 may adjust its drivability of inversely driving the second phase clock signal SCLKI. As the value of the odd bits R<0,2,4,6> increases, the drivability of the first mixing driver 511 may increase, and the drivability of the second mixing driver 512 may decrease. As the value of the odd bits R<0,2,4,6> decreases, the drivability of the first mixing driver 511 may decrease, and the drivability of the second mixing driver 512 may increase. The first inverter 513 may receive outputs of the first mixing driver 511 and the second mixing driver 512. The first inverter 513 may inversely drive the outputs of the first mixing driver 511 and the second mixing driver 512. The second inverter 514 may inversely drive an output of the first inverter 513. The first inverter 513 and the second inverter 514 may mix, one to one, phases of the outputs of the first mixing driver 511 and the second mixing driver 512.

The second mixer 520 may include a third inverter 521, a fourth inverter 522, a third mixing driver 523, a fourth mixing driver 524, and a fifth inverter 525. The third inverter 521 may inversely drive the first phase clock signal FCLKI. The fourth inverter 522 may inversely drive the second phase clock signal SCLKI. Each of the third mixing driver 523 and the fourth mixing driver 524 may include a plurality of inverters configured to individual bits of the weight R<0:7>. When the weight R<0:7> has eight bits, each of the third mixing driver 523 and the fourth mixing driver 524 may include four inverters configured to respectively receive even bits R<1,3,5,7> of the weight R<0:7>. The third mixing driver 523 may receive the even bits R<1,3,5,7>. The third mixing driver 523 may adjust its drivability of inversely driving the inverted first phase clock signal FCLKI. The fourth mixing driver 524 may receive inverted signals RB<1,3,5,7> of the even bits R<1,3,5,7>. The fourth mixing driver 524 may adjust its drivability of inversely driving the inverted second phase clock signal SCLKI. As the value of the even bits R<1,3,5,7> decreases, the drivability of the third mixing driver 523 may increase, and the drivability of the fourth mixing driver 524 may decrease. As the value of the even bits R<1,3,5,7> increases, the drivability of the third mixing driver 523 may decrease, and the drivability of the fourth mixing driver 524 may increase. The fifth inverter 525 may receive outputs of the third mixing driver 523 and the fourth mixing driver 524. The fifth inverter 525 may inversely drive the outputs of the third mixing driver 523 and the fourth mixing driver 524. The fifth inverter 525 may mix, one to one, phases of the outputs of the third mixing driver 523 and the fourth mixing driver 524.

The output mixer 530 may include a sixth inverter 531. The sixth inverter 531 may receive outputs of the second inverter 514 and the fifth inverter 525. The sixth inverter 531 may mix phases of the outputs of the second inverter 514 and the fifth inverter 525 to generate the output clock signal CLKOUT. The sixth inverter 531 may mix, one to one, the phases of the outputs of the second inverter 514 and the fifth inverter 525 to generate the output clock signal CLKOUT.

The phase mixer 232 may generate the output clock signal CLKOUT having the phase closer to the phase of the first phase clock signal FCLKI as a number of bits having a first logic level becomes greater within the weight R<0:7>. The phase mixer 232 may generate the output clock signal CLKOUT having the phase closer to the phase of the second phase clock signal SCLKI as a number of bits having a second logic level becomes greater within the weight R<0:7>. Because the phase difference between the first phase clock signal FCLKI and the second phase clock signal SCLKI remains at half of the unit phase, the phase mixer 232 may change stepwise the phase of the output clock signal CLKOUT by an amount of one-eighth of half of the unit phase based on the weight R<0:7>.

Figure 6:
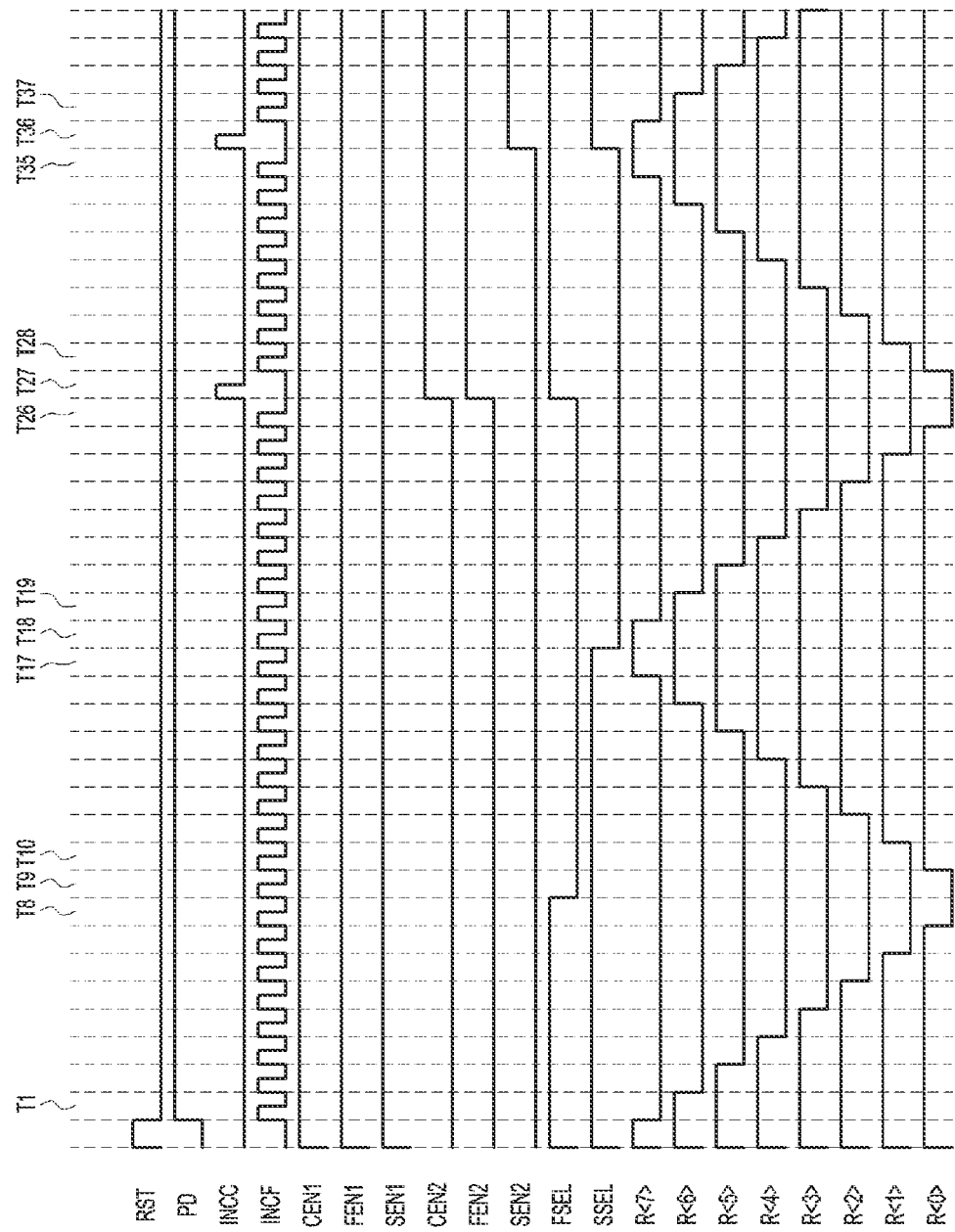
FIG. 6 is a diagram illustrating an operation of a delay locked loop circuit and a delay circuit in accordance with an embodiment.

FIG. 6 is a diagram illustrating an operation of the delay locked loop circuit 120 and the delay circuit 200 in accordance with an embodiment. Hereinafter, described with reference to FIGS. 1 to 6 will be the operation of the delay locked loop circuit 120 and the delay circuit 200 in accordance with an embodiment. The delay locked loop circuit 120 may perform a fine delay locking operation when completing a coarse delay locking operation. It is assumed that only the first enable signal EN1 becomes enabled as the coarse delay locking operation is performed, and the reference clock signal CLKR has the phase leading the feedback clock signal FBCLK. Referring to FIG. 6, an interval between two adjacent broken vertical lines may correspond to an update period of the delay locked loop circuit 120. When the delay locked loop circuit 120 starts the fine delay locking operation, the reset signal RST is enabled and the first clock selecting signal FSEL and the second clock selecting signal SSEL are initialized to a high logic level based on the reset signal RST, and the weight R<0:7> may have its maximum value. The delay header 222 may output the first phase clock signal FCLKI and the second phase clock signal SCLKI having phases respectively corresponding to the first clock signal FCLK and the inverted clock signal ISCLK. First to eighth bits of the weight R<0:7> may have a high logic level. The phase mixer 232 may generate the output clock signal CLKOUT having the phase close to the phase of the first phase clock signal FCLKI. In a first update period T1, the phase detector 123 may compare the phases of the reference clock signal CLKR and the feedback clock signal FBCLK to generate the phase detection signal PD having a high logic level. The delay control circuit 124 may generate the fine increase signal INCF based on the phase detection signal PD. The fine shift register 231 may decrease the logic value of the weight R<0:7>, and the eighth bit R<7> of the weight R<0:7> may have a low logic level. When the phase detection signal PD remains at a high logic level, the logic value of the weight R<0:7> may sequentially decrease, and the phase mixer 232 may generate the output clock signal CLKOUT having the phase close to the phase of the second phase clock signal SCLKI.

In an eighth update period T8, the weight R<0:7> may have its minimum value by the fine shift register 231 and the phase mixer 232 may generate the output clock signal CLKOUT having the phase corresponding to the phase of the second phase clock signal SCLKI. Therefore, the output clock signal CLKOUT may be further delayed by an amount of half (i.e., an amount of a 1-gate delay) of the unit phase with respect to the phase thereof set through the coarse delay locking operation. In a ninth update period T9, the weight R<0:7> may have its minimum value and thus the header controller 221 may disable the first clock selecting signal FSEL to a low logic level. The delay header 222 may output the first delayed clock signal FCLKD and the inverted clock signal ISCLK respectively as the first phase clock signal FCLKI and the second phase clock signal SCLKI. In a tenth update period T10, when the fine increase signal INCF is generated again, the fine shift register 231 may increase again the logic value of the weight R<0:7> and the first bit R<0> of the weight R<0:7> may have a high logic level. When the phase detection signal PD remains at a high logic level, the logic value of the weight R<0:7> may sequentially increase and the phase mixer 232 may generate the output clock signal CLKOUT having the phase close to the phase of the first phase clock signal FCLKI.

In a seventeenth update period T17, the weight R<0:7> may have its maximum value by the fine shift register 231 and the phase mixer 232 may generate the output clock signal CLKOUT having the phase corresponding to the phase of the first phase clock signal FCLKI. Therefore, the output clock signal CLKOUT may be further delayed by the unit phase (i.e., an amount of a 2-gate delay) with respect to the phase thereof set through the coarse delay locking operation. In an eighteenth update period T18, the weight R<0:7> may have its maximum value and thus the header controller 221 may disable the second clock selecting signal SSEL to a low logic level. The delay header 222 may output the first delayed clock signal FCLKD and the second delayed clock signal ISCLKD respectively as the first phase clock signal FCLKI and the second phase clock signal SCLKI. In a nineteenth period T19, when the fine increase signal INCF is generated again, the fine shift register 231 may decrease again the logic value of the weight R<0:7> and the eighth bit R<7> of the weight R<0:7> may have a low logic level. When the phase detection signal PD remains at a high logic level, the logic value of the weight R<0:7> may sequentially decrease and the phase mixer 232 may generate the output clock signal CLKOUT having the phase close to the phase of the second phase clock signal SCLKI.

In a twenty-sixth update period T26, the weight R<0:7> may have its minimum value by the fine shift register 231 and the phase mixer 232 may generate the output clock signal CLKOUT having the phase corresponding to the phase of the second phase clock signal SCLKI. Therefore, the output clock signal CLKOUT may be further delayed by an amount of one and a half of the unit phase (i.e., an amount of a 3-gate delay) with respect to the phase thereof set through the coarse delay locking operation. In a twenty-seventh update period T27, the weight R<0:7> may have its minimum value and thus the header controller 221 may enable the first clock selecting signal FSEL to a high logic level. The delay control circuit 124 may detect the transition of the first clock selecting signal FSEL from a low logic level to a high logic level to generate the coarse increase signal INCC. The coarse shift register 211 may enable the second cell enable signal CEN2 and the second up-enable signal FEN2 of the second enable signal EN2. When the second cell enable signal CEN2 and the second up-enable signal FEN2 are enabled, the coarse delay line 212 may generate the second clock signal SCLK, which is the reference clock signal CLKR delayed by an amount of a 5-gate delay, and the first clock signal FCLK, which is the reference clock signal CLKR delayed by an amount of a 9-gate delay. The delay header 222 may output the first clock signal FCLK and the second delayed clock signal ISCLKD respectively as the first phase clock signal FCLKI and the second phase clock signal SCLKI. The first clock signal FCLK may have a phase lagging behind the second clock signal SCLK by an amount of a 4-gate delay. The second delayed clock signal ISCLKD may have a phase lagging behind the first clock signal FCLK by an amount of a 3-gate delay. Therefore, the phase difference between the first phase clock signal FCLKI and the second phase clock signal SCLKI may remain at half of the unit phase (i.e., an amount of a 1-gate delay). In a twenty-eighth update period T28, when the fine increase signal INCF is generated again, the fine shift register 231 may increase again the logic value of the weight R<0:7> and the first bit R<0> of the weight R<0:7> may have a high logic level. When the phase detection signal PD remains at a high logic level, the logic value of the weight R<0:7> may sequentially increase and the phase mixer 232 may generate the output clock signal CLKOUT having the phase close to the phase of the first phase clock signal FCLKI.

In a thirty-fifth update period T35, the weight R<0:7> may have its maximum value by the fine shift register 231 and the phase mixer 232 may generate the output clock signal CLKOUT having the phase corresponding to the phase of the first phase clock signal FCLKI. Therefore, the output clock signal CLKOUT may be further delayed by an amount of double the unit phase (i.e., an amount of a 4-gate delay) with respect to the phase thereof set through the coarse delay locking operation. In a thirty-sixth update period T36, the weight R<0:7> may have its maximum value and thus the header controller 221 may enable the second clock selecting signal SSEL to a high logic level. The delay control circuit 124 may detect the transition of the second clock selecting signal SSEL from a low logic level to a high logic level to enable the second down-enable signal SEN2 of the second enable signal EN2. When all of the second cell enable signal CEN2, the second up-enable signal FEN2, and the second down-enable signal SEN2 are enabled, the coarse delay line 212 may generate the first clock signal FCLK and the second clock signal SCLK delayed by a 9-gate delay. The delay header 222 may output the first clock signal FCLK and the inverted clock signal ISCLK respectively as the first phase clock signal FCLKI and the second phase clock signal SCLKI. Therefore, the phase difference between the first phase clock signal FCLKI and the second phase clock signal SCLKI may remain at half of the unit phase (i.e., an amount of a 1-gate delay). In a thirty-seventh update period T37, when the fine increase signal INCF is generated again, the fine shift register 231 may decrease again the logic value of the weight R<0:7> and the eighth bit R<7> of the weight R<0:7> may have a low logic level. When the phase detection signal PD remains at a high logic level, the logic value of the weight R<0:7> may sequentially decrease and the phase mixer 232 may generate the output clock signal CLKOUT having the phase close to the phase of the second phase clock signal SCLKI.

After that, the above-described operation is repeatedly performed and the phase of the output clock signal CLKOUT may be seamlessly delayed stepwise. When the feedback clock signal FBCLK has the phase leading the reference clock signal CLKR as the output clock signal CLKOUT is delayed, the phase detection signal PD may come to have a low logic level. The delay control circuit 124 may complete the fine delay locking operation and might not generate anymore the fine increase signal INCF and the fine decrease signal DECF.

When the unit delay time of the coarse delay line 212 decreases, an amount of time to complete the coarse delay locking operation may increase. When the unit delay time of the coarse delay line 212 increases, it may be hard to precisely perform the coarse delay locking operation. Therefore, it may be important to set the unit delay time of the coarse delay line 212 properly. According to an embodiment, the unit delay time of the coarse delay line 212 may be set to an amount of a 4-gate delay. When utilizing a general header circuit, the phase difference between the first phase clock signal FCLKI and the second phase clock signal SCLKI, which are provided to the phase mixing circuit 230, may be an amount of a 2-gate delay corresponding to half of the unit delay time of the coarse delay line 212. At this time, when the phase mixing operation is performed with the weight R<0:7> configured by 8 bits according to an embodiment, the phase of the output clock signal CLKOUT may change stepwise by an amount of one-eighth of a 2-gate delay during the fine delay locking operation. In order to increase the resolution of the phase mixer, a number of bits should increase within the weight and a number of inverters should increase for configuring the mixing driver. However, when utilizing the header circuit 220 according to an embodiment, the phase difference between the first phase clock signal FCLKI and the second phase clock signal SCLKI, which are provided to the phase mixing circuit 230, may be maintained to an amount of a 1-gate delay. Therefore, even when the phase mixing operation is performed with the weight R<0:7> configured by 8 bits, the phase of the output clock signal CLKOUT may change stepwise by an amount of one-eighth of a 1-gate delay during the fine delay locking operation. Accordingly, it may be possible to perform more precisely a delay locking operation. Further, the header circuit 220 and the phase mixing circuit 230 may operate according to the seamless boundary switching scheme in order to mix the phase of the output clock signal CLKOUT. That is, the weight R<0:7> may increase to its maximum value and decrease to its minimum value, repeatedly. Whenever the weight R<0:7> reaches its maximum value or its minimum value, the header circuit 220 may change a phase clock signal having a leading phase between the first phase clock signal FCLKI and the second phase clock signal SCLKI. Therefore, even when the delay time of the coarse delay line changes due to the logic level change of the first clock selecting signal FSEL and the second clock selecting signal SSEL during the fine delay locking operation, there might not occur jitter and the linearity of the phase mixing operation may be improved.

Figure 7:
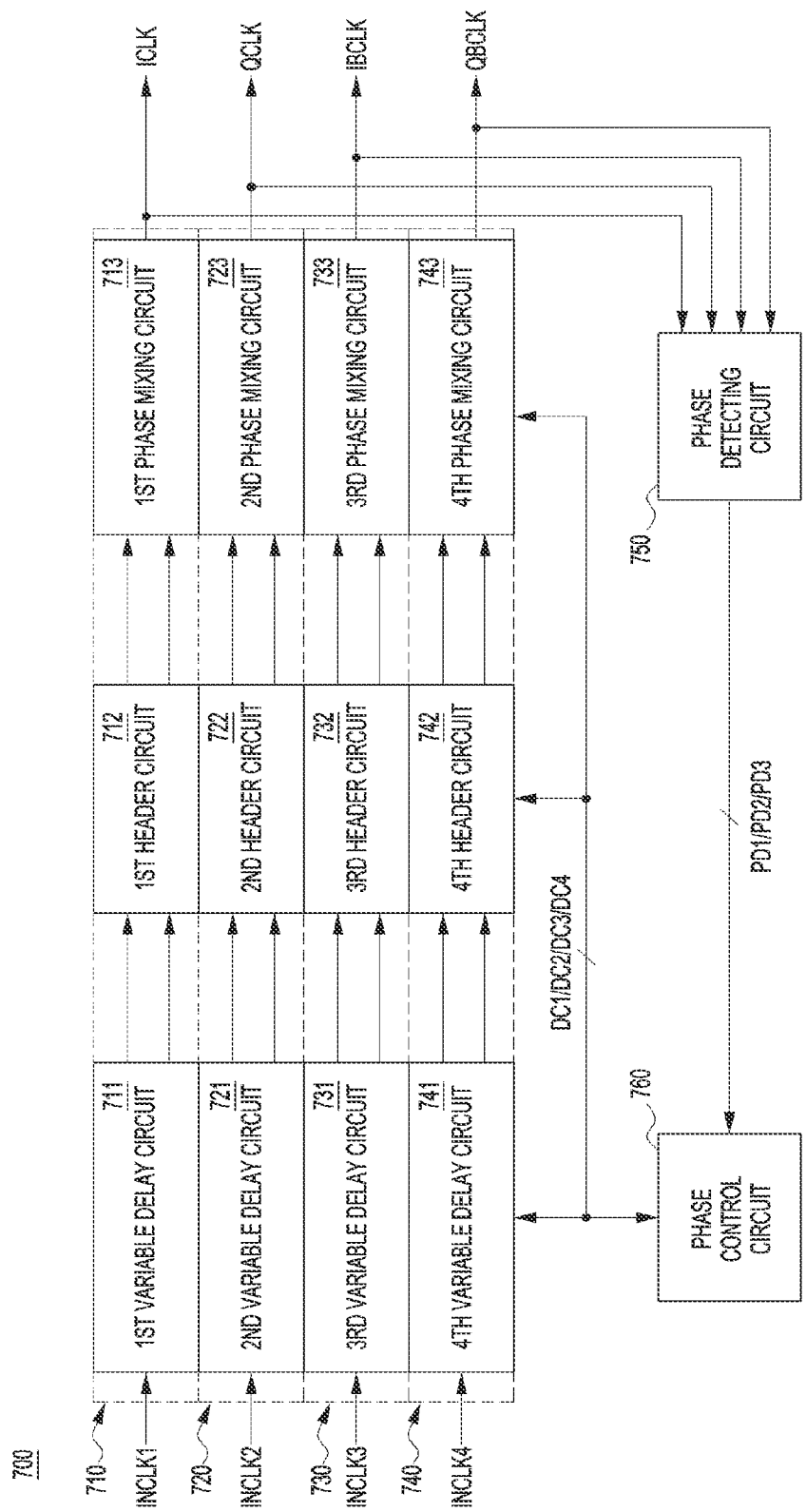
FIG. 7 is a diagram illustrating a configuration of a clock generating circuit in accordance with an embodiment.

FIG. 7 is a diagram illustrating a configuration of a clock generating circuit 700 in accordance with an embodiment. The clock generating circuit 700 may be applied as a circuit of various types, such as a multi-phase clock generating circuit, a duty correction circuit, and so forth. Referring to FIG. 7, the clock generating circuit 700 may receive a first input clock signal INCLK1, a second input clock signal INCLK2, a third input clock signal INCLK3, and a fourth input clock signal INCLK4 to generate a first output clock signal ICLK, a second output clock signal QCLK, a third output clock signal IBCLK, and a fourth output clock signal QBCLK. The first to fourth input clock signals INCLK1, INCLK2, INCLK3, and INCLK4 may have sequentially a phase difference of 90°. Phases of the first to fourth output clock signals ICLK, QCLK, IBCLK, and QBCLK may correspond respectively to the phases of the first to fourth input clock signals INCLK1, INCLK2, INCLK3, and INCLK4. The clock generating circuit 700 may keep the phase difference of 90° and the duty ratio of 50:50 of the first to fourth output clock signals ICLK, QCLK, IBCLK, and QBCLK, by detecting the phases of the first to fourth output clock signals ICLK, QCLK, IBCLK, and QBCLK and adjusting delay times by which the first to fourth input clock signals INCLK1, INCLK2, INCLK3, and INCLK4 are delayed.

The clock generating circuit 700 may include a first clock path 710, a second clock path 720, a third clock path 730, a fourth clock path 740, a phase detecting circuit 750, and a phase control circuit 760. The first clock path 710 may receive the first input clock signal INCLK1. The first clock path 710 may variably delay the first input clock signal INCLK1 based on a first delay control signal DC1 to generate the first output clock signal ICLK. The second clock path 720 may receive the second input clock signal INCLK2. The second clock path 720 may variably delay the second input clock signal INCLK2 based on a second delay control signal DC2 to generate the second output clock signal QCLK. The third clock path 730 may receive the third input clock signal INCLK3. The third clock path 730 may variably delay the third input clock signal INCLK3 based on a third delay control signal DC3 to generate the third output clock signal IBCLK. The fourth clock path 740 may receive the fourth input clock signal INCLK4. The fourth clock path 740 may variably delay the fourth input clock signal INCLK4 based on a fourth delay control signal DC4 to generate the fourth output clock signal QBCLK.

The phase detecting circuit 750 may receive the first to fourth output clock signals ICLK, QCLK, IBCLK, and QBCLK. The phase detecting circuit 750 may compare the phases of the first to fourth output clock signals ICLK, QCLK, IBCLK, and QBCLK to generate phase detection signals. In an embodiment, with respect to the first output clock signal ICLK, the phase detecting circuit 750 may compare the phase of the first output clock signal ICLK with each phase of the second to fourth output clock signals QCLK, IBCLK, and QBCLK to generate a first phase detection signal PD1, a second phase detection signal PD2, and a third phase detection signal PD3. In an embodiment, the phase detecting circuit 750 may compare the phases between two or more output clock signals having neighbouring phases among the first to fourth output clock signals ICLK, QCLK, IBCLK, and QBCLK to generate the first to third phase detection signals PD1, PD2, and PD3. For example, the phase detecting circuit 750 may compare the phases between the first output clock signal ICLK and the second output clock signal QCLK to generate the first phase detection signal PD1, may compare the phases between the second output clock signal QCLK and the third output clock signal IBCLK to generate the second phase detection signal PD2, and may compare the phases between the third output clock signal IBCLK and the fourth output clock signal QBCLK to generate the third phase detection signal PD3. This disclosure does not limit the configuration and the operation of the phase detecting circuit 750 to those described above, and any known phase detecting circuit configured to detect the phases of four clock signals may be applied as the phase detecting circuit 750.

Based on the first to third phase detection signals PD1, PD2, and PD3, the phase control circuit 760 may generate the first delay control signal DC1, the second delay control signal DC2, the third delay control signal DC3, and the fourth delay control signal DC4. The phase control circuit 760 may generate the first to fourth delay control signals DC1, DC2, DC3, and DC4 having default values. Based on the first to third phase detection signals PD1, PD2, and PD3, the phase control circuit 760 may change and/or update the values of the second to fourth delay control signals DC2, DC3, and DC4. Based on the first to fourth delay control signals DC1, DC2, DC3, and DC4, the first to fourth clock paths 710, 720, 730, and 740 may change the time amounts that the first to fourth input clock signals INCLK1, INCLK2, INCLK3, and INCLK4 are delayed.

The first clock path 710 may include a first variable delay circuit 711, a first header circuit 712, and a first phase mixing circuit 713. The first variable delay circuit 711 may be a coarse delay circuit. The first header circuit 712 and the first phase mixing circuit 713 may configure a fine delay circuit. The coarse delay circuit 210, the header circuit 220, and the phase mixing circuit 230 of the delay circuit 200 illustrated in FIG. 2 may be applied respectively as the first variable delay circuit 711, the first header circuit 712, and the first phase mixing circuit 713. The second clock path 720 may include a second variable delay circuit 721, a second header circuit 722, and a second phase mixing circuit 723. The second variable delay circuit 721 may be a coarse delay circuit. The second header circuit 722 and the second phase mixing circuit 723 may configure a fine delay circuit. The coarse delay circuit 210, the header circuit 220, and the phase mixing circuit 230 of the delay circuit 200 illustrated in FIG. 2 may be applied respectively as the second variable delay circuit 721, the second header circuit 722, and the second phase mixing circuit 723. The third clock path 730 may include a third variable delay circuit 731, a third header circuit 732 and a third phase mixing circuit 733. The third variable delay circuit 731 may be a coarse delay circuit. The third header circuit 732 and the third phase mixing circuit 733 may configure a fine delay circuit. The coarse delay circuit 210, the header circuit 220, and the phase mixing circuit 230 of the delay circuit 200 illustrated in FIG. 2 may be applied respectively as the third variable delay circuit 731, the third header circuit 732, and the third phase mixing circuit 733. The fourth clock path 740 may include a fourth variable delay circuit 741, a fourth header circuit 742, and a fourth phase mixing circuit 743. The fourth variable delay circuit 741 may be a coarse delay circuit. The fourth header circuit 742 and the fourth phase mixing circuit 743 may configure a fine delay circuit. The coarse delay circuit 210, the header circuit 220, and the phase mixing circuit 230 of the delay circuit 200 illustrated in FIG. 2 may be applied respectively as the fourth variable delay circuit 741, the fourth header circuit 742, and the fourth phase mixing circuit 743.

A limited number of possible embodiments have been described above. It will be understood by those skilled in the art that the embodiments described above serve only as examples and are not intended to be exhaustive. Accordingly, the delay circuit and a delay locked loop circuit using the same should not be limited based on the described embodiments. Rather, the delay circuit and a delay locked loop circuit using the same described herein should only be limited in light of the claims that follow when taken in conjunction with the above description and accompanying drawings.

What is claimed is:

1. A delay circuit comprising:
    a coarse delay circuit configured to delay a reference clock signal to generate a first clock signal and a second clock signal and configured to change each phase of the first clock signal and the second clock signal by double a unit phase;
    a header circuit configured to receive the first clock signal and the second clock signal and configured to generate a first phase clock signal and a second phase clock signal, between which a phase difference corresponds to half of the unit phase; and
    a phase mixing circuit configured to mix, based on a weight, phases of the first phase clock signal and the second phase clock signal, to mix, based on the weight, a phase of an inverted signal of the first phase clock signal and a phase of an inverted signal of the second phase clock signal, and to mix the mixed signals to generate the output clock signal.

2. The delay circuit of claim 1, wherein the coarse delay circuit is configured to stepwise increase or decrease each phase of the first clock signal and the second clock signal by double the unit phase.

3. The delay circuit of claim 1, wherein the first phase clock signal has a phase leading or lagging behind the second phase clock signal by an amount of half of the unit phase.

4. The delay circuit of claim 1, wherein the header circuit includes:
    a first clock selecting circuit configured to delay the first clock signal by the unit phase to generate a first delayed clock signal and configured to generate, based on a first clock selecting signal, the first phase clock signal from one of the first clock signal and the first delayed clock signal; and
    a second clock selecting circuit configured to inversely drive the second clock signal to generate an inverted clock signal, configured to delay the inverted clock signal by the unit phase to generate a second delayed clock signal, and configured to generate, based on a second clock selecting signal, the second phase clock signal from one of the inverted clock signal and the second delayed clock signal.

5. The delay circuit of claim 4, wherein the first clock selecting circuit includes:
    a first inverter configured to inversely drive the first clock signal;
    a second inverter configured to inversely drive an output of the first inverter to generate the first delayed clock signal;
    a first pass gate configured to output the first clock signal when the first clock selecting signal is enabled;
    a second pass gate configured to output the first delayed clock signal when the first clock selecting signal is disabled; and
    a third inverter coupled to the first pass gate and the second pass gate and configured to inversely drive the outputs of the first pass gate and the second pass gate to generate the first phase clock signal.

6. The delay circuit of claim 5, wherein the first clock selecting circuit further includes:
    a dummy inverter configured to receive the first delayed clock signal and configured to inversely drive the first delayed clock signal; and
    a dummy pass gate configured to provide the third inverter with the outputs of the first pass gate and the second pass gate.

7. The delay circuit of claim 4, wherein the second clock selecting circuit includes:
    a first inverter configured to inversely drive the second clock signal to generate the inverted clock signal;
    a second inverter configured to inversely drive the inverted clock signal;
    a third inverter configured to inversely drive an output of the second inverter to generate the second delayed clock signal;
    a first pass gate configured to output the inverted clock signal when the second clock selecting signal is enabled;
    a second pass gate configured to output the second delayed clock signal when the second clock selecting signal is disabled;
    a fourth inverter coupled to the first pass gate and second pass gate and configured to inversely drive the outputs of the first pass gate and the second pass gate; and
    a fifth inverter configured to inversely drive an output of the fourth inverter to generate the second phase clock signal.

8. The delay circuit of claim 1, wherein the phase mixing circuit includes:
    a first mixer configured to mix, based on the weight, the phases of the first phase clock signal and the second phase clock signal;
    a second mixer configured to mix, based on the weight, the phase of an inverted signal of the first phase clock signal and a phase of an inverted signal of the second phase clock signal; and
    an output mixer configured to mix phases of outputs of the first mixer and the second mixer to generate the output clock signal.

9. A delay locked loop circuit comprising:
    a coarse delay circuit configured to delay a reference clock signal to generate a first clock signal and a second clock signal, which has a phase complementary to a phase of the first clock signal, and configured to change, based on a coarse control signal, each phase of the first clock signal and the second clock signal by double a unit phase;
    a header circuit configured to generate, based on a fine control signal, a first phase clock signal and a second phase clock signal between which has a phase difference corresponding to half of the unit phase from the first clock signal and the second clock signal;
    a phase mixing circuit configured to mix, based on a weight determined on a basis of the fine control signal, the phases of the first phase clock signal and the second phase clock signal to generate the output clock signal;

a delay model circuit configured to delay the output clock signal by a modelled delay time to generate a feedback clock signal;

a phase detector configured to detect phases of the reference clock signal and the feedback clock signal to generate a phase detection signal; and a delay control circuit configured to generate the coarse control signal and the fine control signal based on the phase detection signal, wherein a header controller configured to generate, based on the weight, a first clock selecting signal and a second clock selecting signal; and a delay header configured to generate, based on the first clock selecting signal, the first phase clock signal from one of the first input clock signal and a first delayed clock signal, which is the first input clock signal delayed by the unit phase, and configured to generate, based on the second clock selecting signal, the second phase clock signal from one of an inverted clock signal, which is the second input clock signal that is inversely driven, and a second delayed clock signal, which is the inverted clock signal delayed by the unit phase.

10. The delay locked loop circuit of claim 9, wherein the coarse delay circuit is configured to stepwise increase or decrease each phase of the first clock signal and the second clock signal by double the unit phase, based on the coarse control signal.

11. The delay locked loop circuit of claim 8, wherein the header controller is configured to initialize logic levels of the first clock selecting signal and the second clock selecting signal to a first logic level, configured to change the logic level of the first clock selecting signal to its opposite level whenever the weight has a maximum value, and configured to change the logic level of the second clock selecting signal to its opposite level whenever the weight has a minimum value.

12. The delay locked loop circuit of claim 11, wherein the delay control circuit is configured to generate the coarse control signal when the logic level of one of the first clock selecting signal and the second clock selecting signal transitions from a second logic level to the first logic level.

13. The delay locked loop circuit of claim 8, wherein the delay header includes:

a first clock selecting circuit configured to delay the first clock signal by an amount of the unit phase to generate a first delayed clock signal and configured to generate, based on the first clock selecting signal, the first phase clock signal from one of the first clock signal and the first delayed clock signal; and a second clock selecting circuit configured to inversely drive the second clock signal to generate an inverted clock signal, configured to delay the inverted clock signal by an amount of the unit phase to generate a second delayed clock signal and configured to generate, based on the second clock selecting signal, the second phase clock signal from one of the inverted clock signal and the second delayed clock signal.

14. The delay locked loop circuit of claim 13, wherein the first clock selecting circuit includes:

a first inverter configured to inversely drive the first clock signal;

a second inverter configured to inversely drive an output of the first inverter to generate the first delayed clock signal;

a first pass gate configured to output the first clock signal when the first clock selecting signal is enabled;

a second pass gate configured to output the first delayed clock signal when the first clock selecting signal is disabled; and a third inverter coupled to the first pass gate and the second pass gate and configured to inversely drive the outputs of the first pass gate and the second pass gate to generate the first phase clock signal.

15. The delay locked loop circuit of claim 14, wherein the first clock selecting circuit further includes:

a dummy inverter configured to receive the first delayed clock signal and configured to inversely drive the first delayed clock signal; and a dummy pass gate configured to provide the third inverter with the outputs of the first pass gate and the second pass gate.

16. The delay locked loop circuit of claim 13, wherein the second clock selecting circuit includes:

a first inverter configured to inversely drive the second clock signal to generate the inverted clock signal;

a second inverter configured to inversely drive the inverted clock signal;

a third inverter configured to inversely drive an output of the second inverter to generate the second delayed clock signal;

a first pass gate configured to output the inverted clock signal when the second clock selecting signal is enabled;

a second pass gate configured to output the second delayed clock signal when the second clock selecting signal is disabled;

a fourth inverter coupled to the first pass gate and the second pass gate and configured to inversely drive the outputs of the first pass gate and the second pass gate; and a fifth inverter configured to inversely drive an output of the fourth inverter to generate the second phase clock signal.

17. The delay locked loop circuit of claim 8, wherein the phase mixing circuit includes:

a fine shift register configured to increase or decrease stepwise a value of the weight based on the fine control signal; and a phase mixer configured to receive the first phase clock signal and the second phase clock signal and configured to mix, based on the weight, the phases of the first phase clock signal and the second phase clock signal to generate the output clock signal.

18. The delay locked loop circuit of claim 17, wherein the phase mixer includes:

a first mixer configured to mix, according to a first weight, the phases of the first phase clock signal and the second phase clock signal;

a second mixer configured to mix, according to a second weight, a phase of an inverted signal of the first phase clock signal and a phase of an inverted signal of the second phase clock signal; and an output mixer configured to mix phases of outputs of the first mixer and the second mixer to generate the output clock signal.

* * * * *